(12) United States Patent
Sunaga et al.

(10) Patent No.: US 8,314,531 B2
(45) Date of Patent: Nov. 20, 2012

(54) PIEZOELECTRIC ACTUATOR DRIVER CIRCUIT

(75) Inventors: Midori Sunaga, Higashiomi (JP); Toshinari Tabata, Otsu (JP); Gaku Kamitani, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 166 days.

(21) Appl. No.: 12/883,291

(22) Filed: Sep. 16, 2010

(65) Prior Publication Data

US 2011/0068657 A1     Mar. 24, 2011

(30) Foreign Application Priority Data

Sep. 18, 2009  (JP) ................. 2009-218187

(51) Int. Cl.
  *H01L 41/09*   (2006.01)
  *H02N 2/06*    (2006.01)
(52) U.S. Cl. ...................................... 310/317
(58) Field of Classification Search .................... 310/317
  See application file for complete search history.

(56) References Cited

U.S. PATENT DOCUMENTS

| | | | |
|---|---|---|---|
| 4,692,649 A * | 9/1987 | Izukawa et al. | 310/316.02 |
| 6,586,860 B1 * | 7/2003 | Iino et al. | 310/316.02 |
| 7,861,943 B2 * | 1/2011 | Feriani et al. | 239/102.1 |

FOREIGN PATENT DOCUMENTS

| | | |
|---|---|---|
| JP | 64-085586 A | 3/1989 |
| JP | 6-104501 A | 4/1994 |
| JP | 2004-104339 A | 4/2004 |
| JP | 2008-70333 A | 3/2008 |
| JP | 2008-508844 A | 3/2008 |
| JP | 2009-195053 A | 8/2009 |
| WO | 2006/022820 A2 | 3/2006 |

OTHER PUBLICATIONS

Kamitani et al., "Development of Piezoelectric Micro Blower", The Journal of Fuel Cell Technology, vol. 8, No. 4, Apr. 30, 2009, pp. 148-151.

* cited by examiner

*Primary Examiner* — Derek Rosenau
(74) *Attorney, Agent, or Firm* — Keating & Bennett, LLP (57) ABSTRACT

In a piezoelectric-actuator driving circuit for driving a piezoelectric actuator, an amplifier circuit amplifies a signal output from a feedback circuit and supplies the amplified signal to a non-inverting amplifier circuit and an inverting amplifier circuit. The non-inverting amplifier circuit amplifies the output voltage of the amplifier circuit with a predetermined gain and applies the amplified voltage to a first terminal of the piezoelectric actuator. The inverting amplifier circuit inverts and amplifies the output voltage of the amplifier circuit with the same gain as that of the non-inverting amplifier circuit and then applies the amplified voltage to a second terminal of the piezoelectric actuator through resistors. The feedback circuit amplifies a difference between voltages at respective ends of the resistor and supplies the amplified difference to the amplifier circuit.

6 Claims, 6 Drawing Sheets

PIEZOELECTRIC ACTUATOR DRIVER CIRCUIT

BACKGROUND OF THE INVENTION

1. Field of the Invention

The present invention relates to resonant driving circuits for piezoelectric actuators for vibrating vibrators.

2. Description of the Related Art

Piezoelectric actuators often include electrodes and piezoelectric materials, such as lead zirconate titanate (PZT) ceramics. The piezoelectric actuators are basically voltage driven devices because voltage applied thereto causes the piezoelectric actuators to mechanically deform. The piezoelectric actuators are often driven to resonate. The phrase "to resonant drive" indicates a driving method capable of resonating a piezoelectric apparatus, such as a piezoelectric actuator or a structure including the piezoelectric actuator, at a specific frequency determined in accordance with the mechanical shape/size thereof to yield a large deformation that does not result from a general voltage application method.

To resonant drive a piezoelectric apparatus, alternating voltage having a frequency substantially equal to the resonant frequency of the piezoelectric apparatus is applied to the piezoelectric apparatus. More specifically, for example, an oscillation circuit arranged to generate alternating voltage of the resonant frequency may be connected to the piezoelectric apparatus through a power amplifier.

However, since the resonant frequency differs for each of various different piezoelectric apparatuses because of process variations of the piezoelectric apparatuses and insufficient accuracy of positions of piezoelectric actuators attached to vibrators, it is difficult to resonant drive the piezoelectric apparatuses simply by applying an alternating signal of a predetermined fixed frequency to the piezoelectric apparatuses. The frequency of the applied alternating voltage may be adjusted for each piezoelectric apparatus. However, since the resonant frequency of the piezoelectric apparatus greatly changes depending on temperature, stable resonant driving the piezoelectric apparatuses is still difficult even with such adjustment.

In the related art, self-drive circuits for resonant driving (hereinafter, referred to as self-resonant-driving circuits) have been proposed that automatically determine the resonant frequency of piezoelectric apparatuses and generate alternating signals of the determined frequency. In one example of such a self-resonant-driving circuit, a piezoelectric actuator includes electrodes and a terminal for detecting an amount of deformation to define a three-electrode piezoelectric actuator. A self-resonant-driving circuit is configured to receive a driving signal that is applied to the piezoelectric actuator and then positively fed back through the deformation-amount detecting terminal. That is, this example is a method for driving and controlling the piezoelectric actuator so that the maximum deformation of the piezoelectric actuator is obtained.

However, since such a three-electrode piezoelectric actuator requires a complicated manufacturing process, the manufacturing costs are increased. Additionally, particularly in a piezoelectric actuator having large vibration amplitude, a large distortion is caused between a driven portion that greatly deforms and a non-self-deforming portion including the deformation-amount detecting electrode. The large distortion damages the piezoelectric actuator.

When a two-electrode piezoelectric actuator is used that is tolerant to the large distortion and does not includes the deformation-amount detecting electrode, a circuit configuration can be used in which the piezoelectric actuator is included in a resonant system of a driving circuit so that the frequency of the alternating voltage applied to the piezoelectric actuator is controlled to match actual resonant frequency of the piezoelectric actuator.

Figure 1:
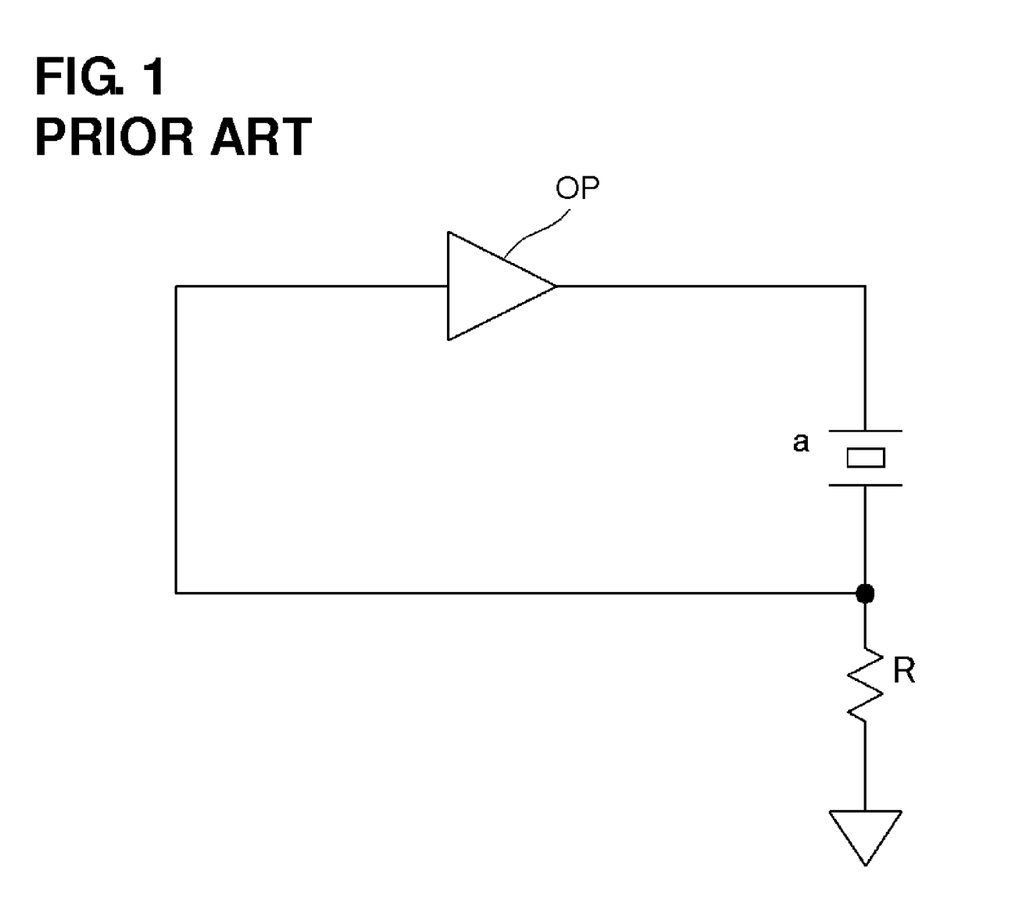
FIG. 1 is a diagram illustrating a basic configuration of a conventional piezoelectric-actuator driving circuit illustrated in the article written by Gaku Kamitani, Kiyoshi Kurihara, and Atsuhiko Hirata on pages 148-151 and FIG. 2 of "Nenryo Denchi (The Journal of Fuel Cell Technology)" Vol. 8 No. 4, 2009, issued by Fuel Cell Development Information Center on Apr. 30, 2009.

A self-resonant-driving circuit is described in the Magazine "Fuel Cell", written by Kamiya Gaku, Kurihara Kiyoshi, and Hirata Atsuhiko, published by Fuel Cell Development Information Center, Apr. 30, 2009, VOL. 8, No. 4 2009, P148-151, FIG. 2. FIG. 1 is a diagram illustrating a basic configuration of a piezoelectric-actuator driving circuit described in the article. A current path of a piezoelectric actuator "a" includes a current detecting resistor R. The resistor R extracts a voltage signal proportional to current flowing through the piezoelectric actuator "a". An operational amplifier OP supplied with the positively fed back voltage signal drives the piezoelectric actuator at a frequency where a voltage/current phase difference of the piezoelectric actuator is substantially equal to 0°.

Since a self-resonant-driving circuit for resonant driving an element with a resonance characteristic, such as a piezoelectric actuator, has a complicated circuit configuration, one terminal of the piezoelectric actuator is connected to ground as illustrated in FIG. 1. When an increased vibration amplitude is desired for the piezoelectric actuator illustrated in FIG. 1, higher power supply voltage is needed.

More specifically, to vibrate the piezoelectric actuator at large amplitude, alternating voltage generated from direct-current (DC) voltage that is greater than the power supply voltage of an oscillation circuit is typically applied to the piezoelectric actuator. The higher DC voltage is generated from the power supply voltage of the oscillation circuit.

Including a DC to DC converter in a driving circuit to boost voltage increases the number of components of the driving circuit. Additionally, the use of high voltage components increases the size of the driving circuit. Furthermore, since the many components of the driving circuit have to be resistant to high voltage, the cost thereof increases.

SUMMARY OF THE INVENTION

To overcome the problems described above, preferred embodiments of the present invention provide a self-resonant-driving circuit capable of applying an alternating voltage having sufficiently large amplitude to piezoelectric apparatuses without an expensive boosting circuit.

A piezoelectric-actuator driving circuit according to a preferred embodiment of the present invention includes a positive feedback circuit arranged to amplify a detection signal generated in response to the application of a voltage to a piezoelectric actuator and positively feed back the amplified detection signal to the piezoelectric actuator.

The positive feedback circuit includes an amplifier circuit, a feedback circuit arranged to feed back voltage of the detection signal, a non-inverting amplifier circuit arranged to output and apply a voltage in phase with an output of the amplifier circuit to a first terminal of the piezoelectric actuator, and an inverting amplifier circuit arranged to output and apply a voltage that is opposite in phase with the output of the amplifier circuit to a second terminal of the piezoelectric actuator.

The feedback circuit may preferably detect and feed back voltages at respective ends of a resistor inserted in a path of current flowing through the piezoelectric actuator.

The non-inverting amplifier circuit and the inverting amplifier circuit may preferably define a balanced driving circuit.

The balanced driving circuit converts an unbalanced signal output from the amplifier circuit into a balanced signal with the non-inverting amplifier circuit and the inverting amplifier circuit. The feedback circuit amplifies the difference between the voltages at the respective ends of the resistor inserted in the path of the current flowing through the piezoelectric actuator and converts the amplified difference into an unbalanced signal. The feedback circuit is connected to the output from the non-inverting amplifier circuit or the output from the inverting amplifier circuit of the balanced driving circuit. Furthermore, the unbalanced signal output from the feedback circuit is input to the amplifier circuit.

To prevent an unstable operation caused by unnecessary vibration modes, a filter may preferably be disposed on an output side of the feedback circuit. The filter passes signals in the vicinity of a resonant frequency of a piezoelectric apparatus but eliminates signals of the other frequencies and may preferably be a band-pass filter. However, since the unnecessary vibration modes often appear at higher-order resonant frequencies (harmonic frequencies), in practice, the filter may preferably be a low-pass filter.

Since alternating voltage can be set to have a frequency such that a voltage/current phase difference of the piezoelectric apparatus becomes substantially equal to 0°, the use of the band-pass filter can achieve more stable circuit oscillation.

A negative feedback circuit for the amplifier circuit may preferably include a band-elimination filter arranged to eliminate a signal of a fundamental resonant frequency of the piezoelectric apparatus including the piezoelectric actuator.

To maintain the level of the voltage applied to the piezoelectric actuator constant, the negative feedback circuit for the amplifier circuit may include an automatic gain control circuit.

According to a preferred embodiment of the present invention, a self resonant driving circuit can be provided that is capable of applying alternating voltage having a sufficiently large amplitude to piezoelectric apparatuses without an expensive boosting circuit. The driving circuit resonant drives piezoelectric actuators with alternating voltage having an amplitude approximately twice as large as that of power supply voltage. Additionally, since the driving circuit does not include a DC-to-DC converter, the cost of the driving circuit can be decreased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 2:
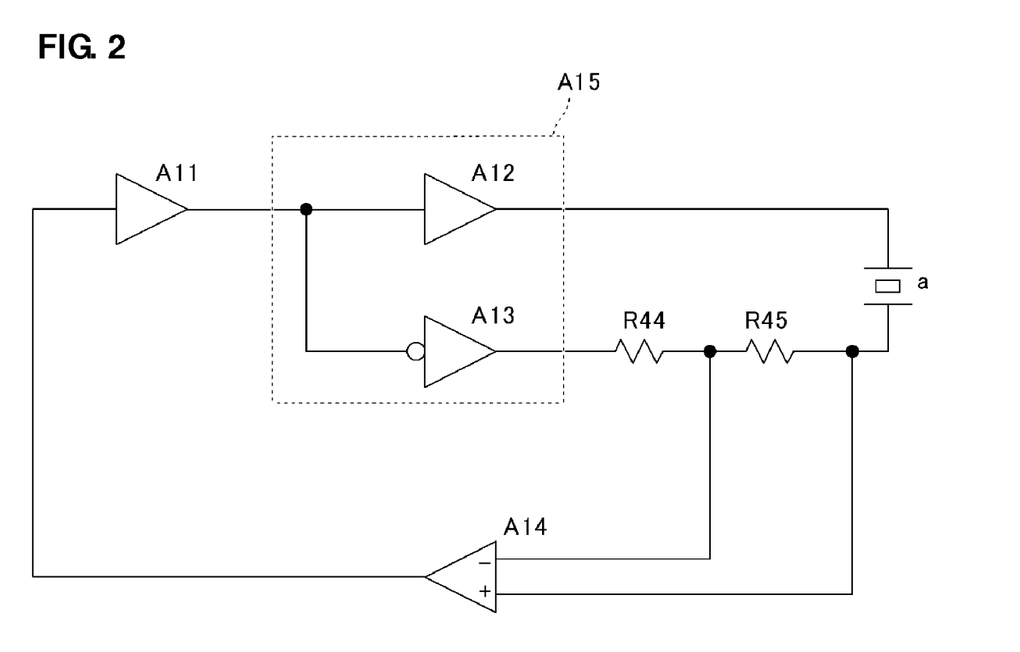
FIG. 2 is a circuit diagram of a piezoelectric-actuator driving circuit according to a first preferred embodiment of the present invention.

FIG. 2 is a circuit diagram of a circuit arranged to drive a piezoelectric actuator, hereinafter, referred to as a piezoelectric-actuator driving circuit, according to a first preferred embodiment of the present invention. An amplifier circuit A11 amplifies a signal output from a feedback circuit A14 and supplies the amplified signal to a non-inverting amplifier circuit A12 and an inverting amplifier circuit A13. The non-inverting amplifier circuit A12 amplifies the voltage signal output from the amplifier circuit A11 with a predetermined gain and applies the amplified voltage to a first terminal of a piezoelectric actuator "a". The inverting amplifier circuit A13 inverts and amplifies the voltage signal output from the amplifier circuit A11 with the same or substantially the same gain as that of the non-inverting amplifier circuit A12. The inverting amplifier circuit A13 then applies the amplified voltage to a second terminal of the piezoelectric actuator "a" through resistors R44 and R45. The feedback circuit A14 extracts, from respective ends of the resistor R45, current (detection signals) flowing through the piezoelectric actuator "a" in response to application of voltage to the piezoelectric actuator "a" as voltage values. The feedback circuit A14 amplifies a difference between the extracted voltage values and then supplies the amplified difference to the amplifier circuit A11.

Each end of the resistor R45 has a voltage proportional to the current flowing through the piezoelectric actuator "a". The feedback circuit A14 amplifies the voltages at the respective ends of the resistor R45 to output an unbalanced signal. At this time, the output voltage of the feedback circuit A14 is set so that a positive feedback circuit having a loop gain preferably exceeding 1, for example, is defined by a path of the amplifier circuits A14, A11, A12, and A13. That is, as the current flowing through the piezoelectric actuator "a" increases, the voltage applied to the piezoelectric actuator "a" increases.

Since impedance Z of the piezoelectric actuator "a" provides resistance, i.e., reactance component=0, at a resonant frequency, the Barkhausen's criteria for oscillation, i.e., the loop gain is equal or approximately equal to 1 or greater and a phase angle is equal or approximately equal to 0°, is satisfied when the frequency of the voltage applied to the piezoelectric actuator "a" is substantially equal to the resonant frequency as long as the gain of the amplifier circuit A11 is sufficiently large. Thus, the piezoelectric actuator "a" oscillates at the resonant frequency of a piezoelectric apparatus including the piezoelectric actuator.

Since the voltage output from the non-inverting amplifier circuit A12 and that from the inverting amplifier circuit A13 have the same or substantially the same amplitude as that of the power supply voltage but are opposite in phase, the piezoelectric actuator "a" is driven at a voltage approximately twice as high as the power supply voltage.

Figure 3:
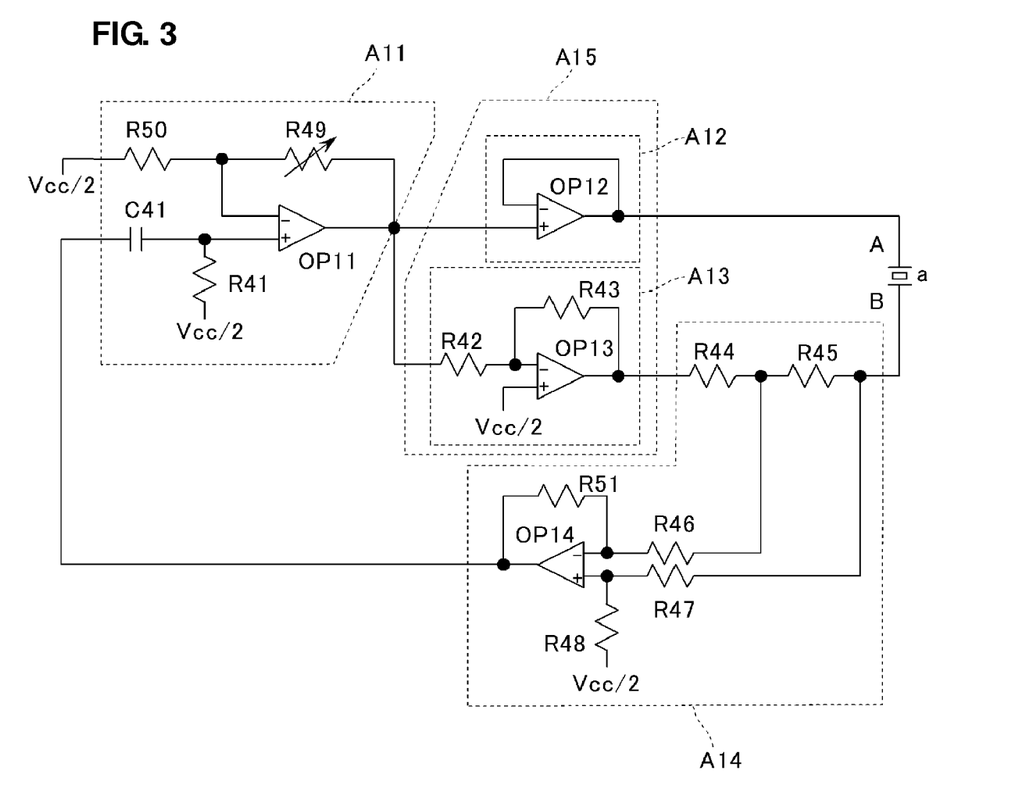
FIG. 3 is a detailed circuit diagram of the piezoelectric-actuator driving circuit illustrated in FIG. 2.

FIG. 3 is a detailed circuit diagram of the piezoelectric actuator illustrated in FIG. 2.

The non-inverting amplifier circuit A12 includes a voltage follower circuit including an operational amplifier OP12. The inverting amplifier circuit A13 includes an operational amplifier OP13 and resistors R42 and R43. The non-inverting amplifier circuit A12 and the inverting amplifier circuit A13 define a balanced driving circuit A15.

The feedback circuit A14 includes a differential amplifier circuit including an operational amplifier OP14 and the resistors R44 and R45, and resistors R46, R47, R48, and R51.

The amplifier circuit A11 includes an operational amplifier OP11, a variable resistor R49, resistors R50 and R41, and a capacitor C41. Output gain of the amplifier circuit A11 is adjusted with a resistance value of the variable resistor R49. When the variable resistor R49 includes a circuit arranged to automatically control the voltage output to the piezoelectric actuator "a" to be constant, automatic gain control (AGC) can be achieved. The capacitor C41 eliminates a DC component included in the output signal of the feedback circuit A14 and sets an amplitude center of the signal of the operational amplifier OP11 substantially equal to a level of Vcc/2 connected thereto through the resistor R41.

Referring to FIG. 3, the power supply voltage Vcc is preferably substantially equal to +12 V, for example. Voltages of approximately +12 V and 0V, for example, are preferably applied to positive and negative power supply terminals of each of the operational amplifiers, respectively. The voltage Vcc/2, i.e., approximately +6 V, for example, is also applied as a reference potential, i.e., an intermediate potential.

Figure 4:
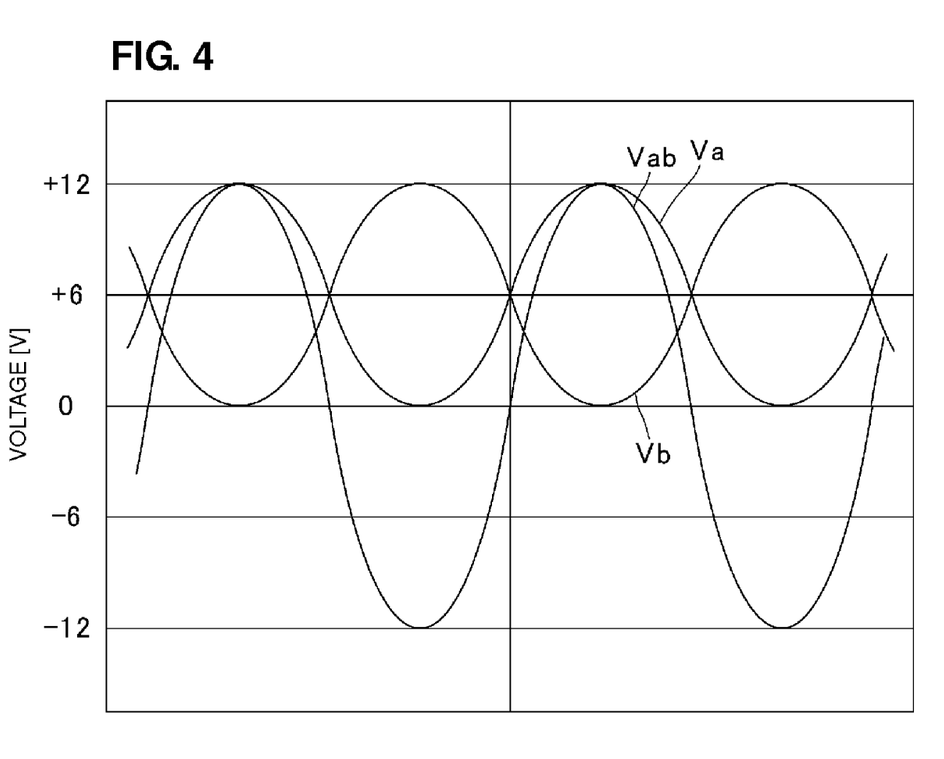
FIG. 4 is a diagram illustrating a waveform of voltage applied to a first terminal of the piezoelectric actuator illustrated in FIG. 3, a waveform of voltage applied to a second terminal of the piezoelectric actuator, and a waveform of voltage applied across the respective terminals of the piezoelectric actuator.

FIG. 4 is a diagram illustrating a waveform of voltage Va applied to a first terminal A of the piezoelectric actuator "a" illustrated in FIG. 3, a waveform of voltage Vb applied to a second terminal B of the piezoelectric actuator "a", and a waveform of voltage Vab applied across the respective terminals A and B of the piezoelectric actuator "a". Since the operational amplifiers OP12 and OP13 operate at the positive power supply voltage of approximately +12 V, for example, and the negative power supply voltage of approximately 0 V, a voltage from approximately 0V to approximately +12V and a voltage from approximately +12 V to approximately 0 V are applied to the first and second terminals A and B of the piezoelectric actuator "a", respectively.

As illustrated in FIG. 4, the voltages Va and Vb applied to the first terminal A and the second terminal B of the piezoelectric actuator "a" are opposite in phase with respect to the reference potential, i.e., approximately +6 V, for example. Accordingly, the voltage Vab applied across the respective terminals of the piezoelectric actuator "a" is calculated as (Va−Vb). For example, when the voltage Va is substantially equal to the maximum value of +12 V and the voltage Vb is opposite in phase, i.e., substantially equal to 0V, the voltage Vab is substantially equal to +12 V=Va−Vb=+12 V−0 V. In addition, when the voltage Va is substantially equal to the minimum value of 0 V and the voltage Vb is in the opposite phase, i.e., substantially equal to +12 V, the voltage Vab is equal to the minimum value of −12 V=Va−Vb=0 V−(+12 V).

Accordingly, the voltage Vab has amplitudes of approximately ±12 V. That is, a peak-to-peak voltage of approximately 24 Vp–p is applied to the piezoelectric actuator "a".

Accordingly, the piezoelectric actuator "a" can be driven at a voltage approximately twice as high as the power supply voltage of approximately 12 V.

For example, a metal blade and the piezoelectric actuator adhered on the metal blade define a piezoelectric fan. The piezoelectric fan has a resonant frequency of, for example, about 95 Hz. The metal blade vibrates at about 95 Hz to send or circulate air.

In addition, the piezoelectric actuator is adhered on a diaphragm defining a wall of a pump room, for example. Vibration of the piezoelectric actuator causes bending vibration in the diaphragm and, ultimately, expansion and shrinkage of the pump room to transport liquids and gases.

Second Preferred Embodiment

Figure 5:
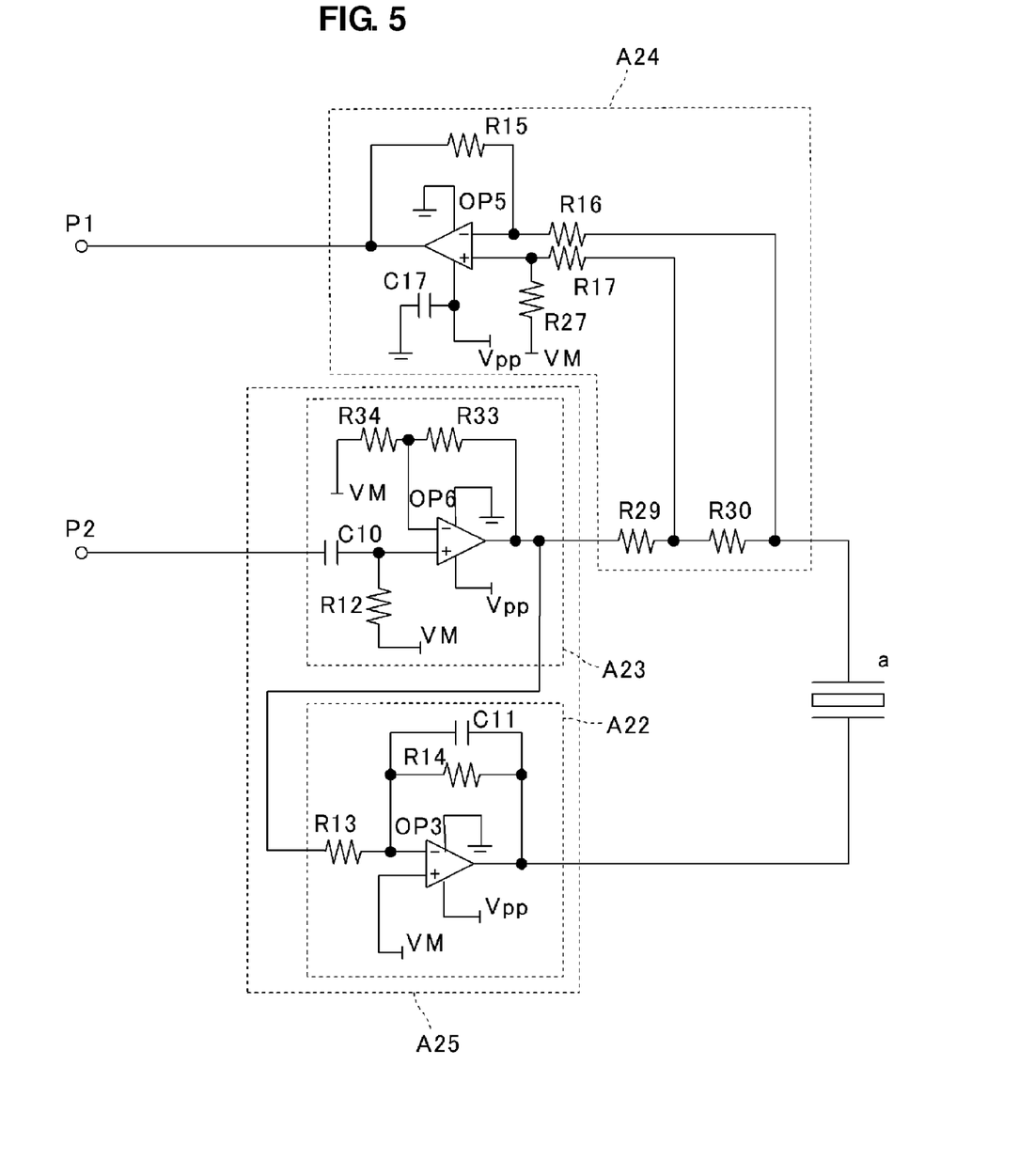
FIG. 5 is a circuit diagram illustrating inverting and non-inverting amplifier circuits arranged to output driving voltage to a piezoelectric actuator and a feedback circuit arranged to detect current flowing through the piezoelectric actuator included in a piezoelectric-actuator driving circuit according to a second preferred embodiment of the present invention.
Figure 6:
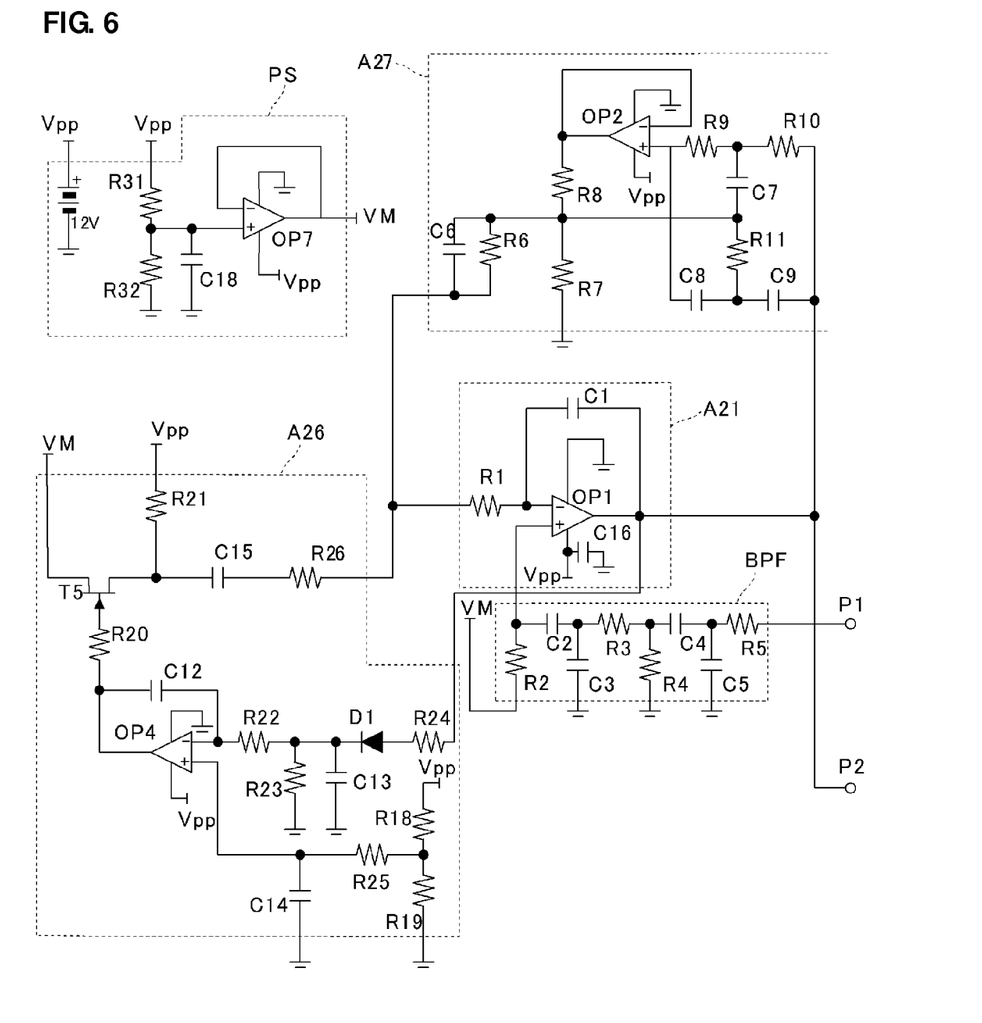
FIG. 6 is a circuit diagram illustrating an amplifier circuit arranged to amplify an output signal of a feedback circuit and feeding the amplified signal back to a balanced driving circuit, a band-pass filter (BPF) disposed between an input terminal of the amplifier circuit and an output terminal of another amplifier terminal, a band-elimination filter (BEF) circuit defining a circuit on a negative feedback side of the amplifier circuit, an automatic gain control (AGC) circuit, and a power supply circuit included in the piezoelectric-actuator driving circuit according to the second preferred embodiment of the present invention.

A piezoelectric-actuator driving circuit according to a second preferred embodiment of the present invention will be described with reference to FIGS. 5 and 6. The second preferred embodiment provides an exemplary circuit in more detail than the circuit described in the first preferred embodiment. FIGS. 5 and 6 illustrate a single circuit. For ease of illustration, the circuit is divided into two portions and each portion is illustrated in the respective FIGS. 5 and 6. The portion illustrated in FIG. 5 is connected to the portion illustrated in FIG. 6 through terminals P1 and P2.

FIG. 5 illustrates an inverting amplifier circuit A22, a non-inverting amplifier circuit A23, and a feedback circuit A24. The inverting amplifier circuit A22 and the non-inverting amplifier circuit A23 output voltage to drive a piezoelectric actuator "a". The feedback circuit A24 detects current flowing through the piezoelectric actuator "a".

The non-inverting amplifier circuit A23 includes an operational amplifier OP6, resistors R12, R33, and R34, and a capacitor C10. The non-inverting amplifier circuit A23 amplifies a signal with a predetermined gain. More specifically, the non-inverting amplifier circuit A23 amplifies a signal input from the terminal P2 with the predetermined gain and supplies the amplified signal to a first terminal of the piezoelectric actuator "a".

The inverting amplifier circuit A22 includes an operational amplifier OP3, resistors R13 and R14, and a capacitor C11. The inverting amplifier circuit A22 inverts and amplifies a signal preferably with a gain of approximately 1, for example. More specifically, the inverting amplifier circuit A22 inverts and amplifies the output signal of the non-inverting amplifier circuit A23 while maintaining the amplitude of the output signal.

The inverting amplifier circuit A22 and the non-inverting amplifier circuit A23 define a balanced driving circuit A25.

The feedback circuit A24 amplifies a difference between voltages at respective ends of a resistor R30 and outputs the amplified different to the terminal P1.

FIG. 6 illustrates an amplifier circuit A21, a band-pass filter BPF, a band-elimination filter (BEF) circuit A27, an automatic gain control (AGC) circuit A26, and a power supply circuit PS. The amplifier circuit A21 amplifies the output signal of the feedback circuit A24 and feeds the amplified signal back to the inverting amplifier circuit A22 and the non-inverting amplifier circuit A23. The band-pass filter BPF is disposed between an input terminal of the amplifier circuit A21 and an output terminal of the feedback circuit A24. The band-elimination filter circuit A27 is located on a negative feedback side of the amplifier circuit A21.

The power supply circuit PS, for example, equally divides a power supply voltage of 12 V DC with resistors R31 and R32 and inputs the divided voltage of approximately 6V DC to a voltage follower circuit including an operational amplifier OP7. In this way, the power supply circuit PS generates a stable reference potential VM, e.g., approximately 6V DC.

The band-pass filter BPF is defined by a low-pass filter including a resistor R5 and a capacitor C5, a high-pass filter including a capacitor C4 and a resistor R4, a low-pass filter including a resistor R3 and a capacitor C3, and a high-pass filter including a capacitor C2 and a resistor R2. A cutoff frequency fc of each filter can be determined by calculating $1/(2\pi RC)$.

The cutoff frequencies of the double-stage high-pass filters are preferably less than a fundamental resonant frequency of a piezoelectric apparatus including the piezoelectric actuator "a". The cutoff frequencies of the double-stage low-pass filters are greater than the fundamental resonant frequency but less than a second harmonic resonant frequency. Accordingly, the band-pass filter BPF passes components of the fundamental frequency but suppresses harmonic components. That is, the band-pass filter BPF functions as a harmonic suppressing filter to suppress signals of higher-order resonant frequencies of the piezoelectric apparatus. Since the harmonic frequency components are not positively fed back, the loop gain at the harmonic frequency bands is preferably equal or substantially equal to 1 or less, for example. Thus, oscillation does not occur at the harmonic frequency bands but occurs at the fundamental frequency of the piezoelectric apparatus including the piezoelectric actuator "a".

A predetermined number of low-pass filters alone can suppress the harmonic components but the RC low-pass filters cause phase delay. To avoid such phase delay, an equal number of CR high-pass filters and RC low-pass filters are provided to set an amount of phase shift substantially equal to 0. More specifically, the amounts of phase shift at the cutoff frequency of one RC low-pass filter and at frequencies sufficiently higher than the cutoff frequency are preferably about −45° and about −90°, respectively. The amounts of phase shift at the cutoff frequency of one CR high-pass filter and at frequencies sufficiently higher than the cutoff frequency are about +45° and about +90°, respectively. Thus, by adjusting the cutoff frequency of each of the low-pass filters and the high-pass filters to the resonant frequency of the fundamental wave, positive feedback can be provided in phase at the resonant frequency of the fundamental wave.

The amplifier circuit A21 defines a positive feedback circuit, i.e., a positive feedback loop, with the inverting amplifier circuits A22, the non-inverting amplifier circuit A23, the feedback circuit A24, and the piezoelectric actuator "a" illustrated in FIG. 5. The amplifier circuit A21 also defines a negative feedback circuit, i.e. a negative feedback loop, with the BEF circuit A27 and the AGC circuit A26.

The BEF circuit A27 includes an operational amplifier OP2, resistors R6, R7, R8, R9, R10, and R11, and capacitors C6, C7, C8 and C9. The resistors R9, R10, and R11 and the capacitors C7, C8, and C9 define a band-elimination filter (BEF) preferably utilizing a so-called twin-T structure, for example. The operational amplifier OP2 amplifies the signal having passed the notch filter or the BEF to create a sharp attenuation characteristic and also lowers output impedance around the resonant frequency of the piezoelectric actuator "a". For example, the resistors are preferably set to satisfy an equation, $R9=R10=2\times R11$, whereas the capacitors are preferably set to satisfy an equation $C8=C9=C7\times 1/2$. A usage state of $f0=1/(2\pi \times R11\times C7)$ is preferably selected. An amount of feedback to a midpoint of the twin T portion is set with the resistors R7 and R8. The capacitor C6 and the resistor R6 divide a voltage signal fed from the AGC circuit A26 to adjust the signal fed back to the amplifier circuit A21.

A rejection frequency of the band-elimination filter BEF can be determined by solving $f0=1/(2\pi \times R11\times C7)$ when $R9=R10=2\times R11$ and $C8=C9=C7\times 1/2$. The rejection frequency is adjusted to be in the vicinity of the resonant frequency of the piezoelectric apparatus including the piezoelectric actuator "a".

An output signal of the BEF circuit A27 is input to an inverting input terminal of the operational amplifier OP1 of the amplifier circuit A21 to be negatively fed back. Since the negative feedback signal has passed the BEF, components of frequencies other than the fundamental resonant frequency are negatively fed back. As a result, the loop gain is sufficiently suppressed, that is, is sufficiently smaller than 1, at the higher-order resonant frequencies and, thus, vibrations at harmonic frequencies are suppressed. That is, the piezoelectric apparatus stably vibrates at the fundamental frequency.

The AGC circuit A26 includes a resistor R26, a capacitor C15, and a field effect transistor T5. The AGC circuit A26 is connected to a contact of the BEF circuit A27 and the amplifier circuit A21. In this manner, a path of the resistor R6 of the BEF circuit A27 and the resistor R26, the capacitor C15, the field effect transistor T5, and a reference potential VM of the AGC circuit A26 is defined. This path functions as a variable attenuator circuit. More specifically, resistance between a drain and a source of the field effect transistor T5 changes depending on an output signal of an operational amplifier OP4. The change in the resistance changes a voltage division ratio of a path of the resistor R6 of the BEF circuit A27, the resistor R26, the capacitor C15, the field effect transistor T5, and the reference potential VM. The change in the voltage division ratio controls attenuation of the negative feedback signal input to the amplifier circuit A21 from a point between the resistor R26 and the resistor R6 and the capacitor C6. That is, the change in the resistance between the drain and the source of the field effect transistor T5 changes the voltage division ratio between the resistors R6 and R26 and amplitude of the negative feedback signal input to the amplifier circuit A21.

The operational amplifier OP4 of the AGC circuit A26 functions as a voltage comparator. A non-inverting input terminal of the operational amplifier OP4 is connected to a reference voltage generator circuit and a low-pass filter including a resistor R25 and a capacitor C14. The reference voltage generator circuit generates a reference voltage resulting from the division of the power supply voltage Vcc with resistors R18 and R19. The low-pass filter stabilizes the reference voltage. On the other hand, an inverting input terminal of the operational amplifier OP4 is connected to a detection circuit arranged to rectify and detect the output signal from the amplifier circuit A21. The detection circuit includes resistors R23 and R24, a diode D1, and a capacitor C13.

If the detected voltage at the inverting input terminal supplied from the amplifier circuit A21 becomes greater than the reference voltage at the non-inverting input terminal, the output potential of the operational amplifier OP4 is reduced. The lowering output potential increases the resistance between the drain and the source of the field effect transistor T5 and the negative feedback to the amplifier circuit A21. Thus, the loop gain of the amplifier circuit A21 decreases and oscillation output is suppressed.

Conversely, if the detected voltage at the inverting input terminal supplied from the amplifier circuit A21 becomes lower than the reference voltage at the non-inverting input terminal, the output potential of the operational amplifier OP4 increases. The rising output potential decreases the resistance between the drain and the source of the field effect transistor T5 and the negative feedback to the amplifier circuit A21. Thus, the loop gain of the amplifier circuit A21 increases and the oscillation output also increases.

A resistor R22 and a capacitor C12 extend a time constant so as to provide a gradual operation.

In the above-described manner, the potential of the inverting input terminal of the operational amplifier OP4 is controlled to be substantially equal to the reference potential of the non-inverting input terminal, whereby automatic gain control is performed.

In the first and second preferred embodiments of the present invention, a waveform of the driving voltage of the piezoelectric actuator is preferably a sine wave, for example. However, the piezoelectric actuator may be driven by a trapezoidal wave or a rectangular wave, i.e., a peak voltage of the sine wave is clipped, by setting the loop gain so that a peak value of the sine wave exceeds the power supply voltage. When harmonics of the trapezoidal wave or the rectangular wave cause uncomfortable audible noises of audio frequencies, the piezoelectric actuator may preferably be driven with a sine wave. To obtain a large amplitude with low driving voltage, the trapezoidal wave or the rectangular wave is more preferable than the sine wave.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric-actuator driving circuit for driving a piezoelectric actuator, comprising:
   a positive feedback circuit arranged to amplify a detection signal generated in response to an application of voltage to the piezoelectric actuator and to positively feedback the amplified detection signal to the piezoelectric actuator, wherein the positive feedback circuit includes:
   an amplifier circuit;
   a feedback circuit arranged to feedback voltage of the detection signal;
   a non-inverting amplifier circuit arranged to output and apply voltage in phase with an output of the amplifier circuit to a first terminal of the piezoelectric actuator; and
   an inverting amplifier circuit arranged to output and apply voltage opposite in phase with the output of the amplifier circuit to a second terminal of the piezoelectric actuator; wherein
   the piezoelectric actuator includes only the first and second terminals and does not include any other terminals.

2. The piezoelectric-actuator driving circuit according to claim 1, wherein the feedback circuit is arranged to detect and feedback voltages at respective ends of a resistor inserted in a path of current flowing through the piezoelectric actuator.

3. The piezoelectric-actuator driving circuit according to claim 1, wherein the non-inverting amplifier circuit and the inverting amplifier circuit define a balanced driving circuit.

4. The piezoelectric-actuator driving circuit according to claim 1, wherein a harmonic suppressing filter arranged to suppress a signal of a higher-order resonant frequency of a piezoelectric apparatus including the piezoelectric actuator is disposed on an output side of the feedback circuit.

5. The piezoelectric-actuator driving circuit according to claim 1, wherein a negative feedback circuit is provided in the amplifier circuit and includes a band-elimination filter arranged to eliminate a signal of a fundamental resonant frequency of a piezoelectric apparatus including the piezoelectric actuator.

6. The piezoelectric-actuator driving circuit according to claim 5, wherein the negative feedback circuit of the amplifier circuit includes an automatic gain control circuit.

* * * * *